United States Patent
Jaiswal

(10) Patent No.: US 7,964,517 B2
(45) Date of Patent: Jun. 21, 2011

(54) USE OF A BIASED PRECOAT FOR REDUCED FIRST WAFER DEFECTS IN HIGH-DENSITY PLASMA PROCESS

(75) Inventor: Rajneesh Jaiswal, Sachse, TX (US)

(73) Assignee: Texas Instruments Incorporated, Dallas, TX (US)

(*) Notice: Subject to any disclaimer, the term of this patent is extended or adjusted under 35 U.S.C. 154(b) by 233 days.

(21) Appl. No.: 12/362,320

(22) Filed: Jan. 29, 2009

(65) Prior Publication Data
US 2010/0190352 A1  Jul. 29, 2010

(51) Int. Cl.
*H01L 21/31* (2006.01)
(52) U.S. Cl. .................. 438/788; 257/E21.279
(58) Field of Classification Search .................. 438/788, 438/793, 909
See application file for complete search history.

(56) References Cited

U.S. PATENT DOCUMENTS
5,976,900 A * 11/1999 Qiao et al. .................. 438/14
* cited by examiner

*Primary Examiner* — Chandra Chaudhari
(74) *Attorney, Agent, or Firm* — Warren L. Franz; Wade J. Brady, III; Frederick J. Telecky, Jr.

(57) ABSTRACT

According to various embodiments, the present teachings include methods for reducing first wafer defects in a high-density plasma chemical vapor deposition process. In an exemplary embodiment, the method can include running a deposition chamber for deposition of film on a first batch of silicon wafers and then cleaning interior surfaces of the deposition chamber. The method can further include inserting a protective electrostatic chuck cover (PEC) wafer on an electrostatic chuck in the deposition chamber and applying power to bias the PEC wafer while simultaneously precoating the deposition chamber with an oxide. The exemplary method can also include re-starting the deposition chamber for deposition of film on a second batch of silicon wafers.

12 Claims, 2 Drawing Sheets

USE OF A BIASED PRECOAT FOR REDUCED FIRST WAFER DEFECTS IN HIGH-DENSITY PLASMA PROCESS

FIELD OF THE INVENTION

The subject matter of this invention relates to chemical vapor deposition processes. More particularly, the subject matter of this invention relates to the use of a biased precoat process for reducing first wafer defects in high-density plasma chemical vapor deposition processes.

DESCRIPTION OF THE RELATED ART

High-density plasma (HDP) chemical vapor deposition (CVD) chambers, such as SPEED™ HDP CVD chambers manufactured by Novellus Systems, are employed to perform HDP CVD processes to deposit films on a substrate in the fabrication of integrated circuits. Existing HDP CVD processes typically perform film deposition with a processing gas mixture that includes oxygen, silane, and inert gases, such as helium, to achieve simultaneous dielectric etching and deposition. During film deposition, RF power is applied to an electrostatic chuck to bias a silicon wafer placed thereon. Some of the gas molecules are ionized in the plasma and accelerate toward the surface of the silicon wafer when the RF power is applied. Film material is thereby sputtered when the ions strike the wafer surface.

However, the film material is also deposited on all the surfaces of the deposition chamber exposed to the processing gas, including the interior surfaces of the deposition chamber. Therefore, the deposition chamber must be periodically cleaned to prevent a build-up of the excess film material from contaminating films deposited on the wafer, which can cause defects in the processed wafer. A conditioning step typically follows the cleaning step to bring the deposition chamber to an equilibrium state. During the conditioning step, a protective cover is placed on the electrostatic chuck to protect the chuck. RF power is not applied during the conditioning step to avoid damaging or breaking the protective cover, and thus the protective cover is unbiased.

After the deposition chamber is cleaned and conditioned, silicon wafers are inserted for film deposition and bias is applied to the wafers. Problems arise because the application of bias on the wafers, and in particular the first wafer after the cleaning and conditioning steps, causes gas flow patterns in the deposition chamber that dislodge loose material from the deposition chamber's dome and injectors. The dislodged material falls on the wafers and becomes embedded in the deposited film, which causes rip-outs during subsequent chemical-mechanical polishing, leading to wafer defects and yield losses.

Existing solution for reducing wafer defects and yield losses caused by dislodged material is to replace the dome and injectors of the deposition chamber. However, replacing the parts requires twelve to sixteen hours of unscheduled downtime on a fabrication tool. Therefore, there is a need to overcome these and other problems of the prior art to provide methods for reducing first wafer defects in high-density plasma chemical vapor deposition processes.

SUMMARY OF THE INVENTION

During high-density plasma chemical vapor deposition (HDP CVD) processing, the interior surfaces of the HDP CVD chamber are cleaned after processing a batch of silicon wafers. After the deposition chamber is cleaned, it is precoated with undoped and doped oxides to condition the deposition chamber. The exemplary methods of the invention provide for an application of high frequency (HF) radio frequency (RF) power to bias a protective electrostatic chuck cover (PEC) wafer via an electrostatic chuck during precoat, which replicates the chamber conditions of a subsequent HDP CVD process on silicon wafers. An application of 500 watts or more of HF RF power that biases the PEC wafer causes gas flow patterns in the deposition chamber that dislodge loose material and particles. If the PEC wafer is not biased during precoat, then the loose material would instead become dislodged when bias is initially applied to a silicon wafer in a film deposition process subsequent to the cleaning and precoat processes.

Furthermore, the application of HF RF power that biases the PEC wafer also produces gas flow patterns in the deposition chamber during precoat that are similar to the gas flow patterns during a subsequent film deposition on silicon wafers, which causes loose particles in the deposition chamber to fall on the PEC wafer during precoat instead of on the silicon wafers and in particular the first silicon wafer during film deposition subsequent to the cleaning and precoat processes. If the loose particles fall on the silicon wafers during film deposition, the loose particles would become embedded in the deposited film and cause rip-outs during chemical-mechanical polishing (CMP). By applying HF RF power that biases the PEC wafer during precoat, the loose particles fall on the PEC wafer instead of the silicon wafers, thereby minimizing yield losses caused by embedded loose particles.

According to various embodiments, the present teachings include a method for reducing first wafer defects that can include inserting a protective cover and applying power to bias the protective cover while simultaneously precoating the deposition chamber.

According to various embodiments, the present teachings include methods for reducing first wafer defects in a high-density plasma chemical vapor deposition process. In an exemplary embodiment, the method can include running a deposition chamber for deposition of film on a first batch of a plurality of silicon wafers and then cleaning interior surfaces of the deposition chamber. The method can further include inserting a PEC wafer on an electrostatic chuck in the deposition chamber and applying power to bias the PEC wafer while simultaneously precoating the deposition chamber with an oxide. The exemplary method can also include re-starting the deposition chamber for deposition of film on a second batch of a plurality of silicon wafers.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DETAILED DESCRIPTION

Reference will now be made in detail to exemplary embodiments of the invention, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

Figure 1:
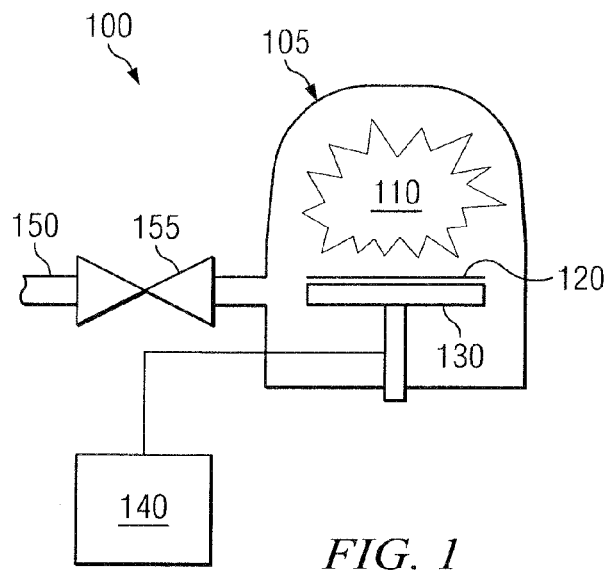
FIG. 1 is a schematic view showing a semiconductor fabrication apparatus according to various embodiments of the invention.

Referring to FIG. 1, which is a schematic view showing a semiconductor fabrication apparatus according to various embodiments of the present teachings. The fabrication apparatus, such as a Novellus SPEED™ HDP CVD apparatus, includes a deposition chamber 100 having an electrostatic chuck (E-chuck) 130. Deposition chamber 100 can include an upper lid or dome 105, typically made of a ceramic such as aluminum oxide ($Al_2O_3$). A gas manifold 150 connecting to deposition chamber 100 can be coupled to an inlet airflow controlling valve 155. In various embodiments, E-chuck 130 is coupled to a radio frequency source (RF source) 140. E-chuck 130 is configured to hold a wafer 120 during high-density plasma (HDP) chemical vapor deposition (CVD) processing, including film deposition, cleaning, precoat, and the like.

Wafer 120 can be a silicon wafer, a dummy wafer, or a protective cover such as a protective electrostatic chuck cover (PEC) wafer made of a ceramic including, for example, aluminum oxide ($Al_2O_3$), aluminum nitride (AlN), silicon carbide (SiC), and the like. The PEC wafer can be used as a surrogate substrate to protect E-chuck 130 from exposure to plasma 100 created in exemplary methods of the invention. Gas manifold 150 can inlet processing gas used to form plasma 110 and the inlet airflow can be controlled by inlet airflow controlling valve 155. Materials deposited during HDP CVD processing include, for example, phosphosilicate glass (PSG), fluorosilicate glass (FSG), undoped silicate glass (USG), and the like. One skilled in the art will appreciate that other materials can be deposited. During the precoat process, processing gases are introduced into deposition chamber 100, and plasma 110 of the processing gases is generated within deposition chamber 100 to precoat the interior surfaces of deposition chamber 100.

RF source 140 can provide 500 or more watts of RF power to bias wafer 120 via E-chuck 130 during HDP CVD processing. According to various embodiments, RF source 140 can provide 500 or more watts of high frequency (HF) RF power to bias the PEC wafer during precoat. Applying bias to the PEC wafer can cause gas flow patterns in deposition chamber 100 that dislodge loose material on dome 105 and one or more injectors to form loose particles. If the PEC wafer is not biased during precoat, then the loose material would instead become dislodged when bias is initially applied to a silicon wafer during film deposition post-clean and post-precoat. Moreover, applying bias to the PEC wafer can produce gas flow patterns in deposition chamber 100 during precoat that are similar to the gas flow patterns during a subsequent film deposition on silicon wafers, and thus cause loose particles in deposition chamber 100 to fall on the PEC wafer during precoat instead of on the silicon wafers and in particular the first silicon wafer processed immediately subsequent to the cleaning and precoat processes. If the loose particles fall on the silicon wafers during film deposition, the loose particles would become embedded in the deposited film and cause rip-outs during chemical-mechanical polishing (CMP). By applying 500 or more watts of HF RF power to bias the PEC wafer during precoat, the loose particles fall on the PEC wafer instead of the silicon wafers during film deposition, thereby minimizing yield losses caused by embedded loose particles. One skilled in the art will appreciate that other methods can be used to electrically bias the PEC wafer to reduce first silicon wafer defects.

Figure 2:
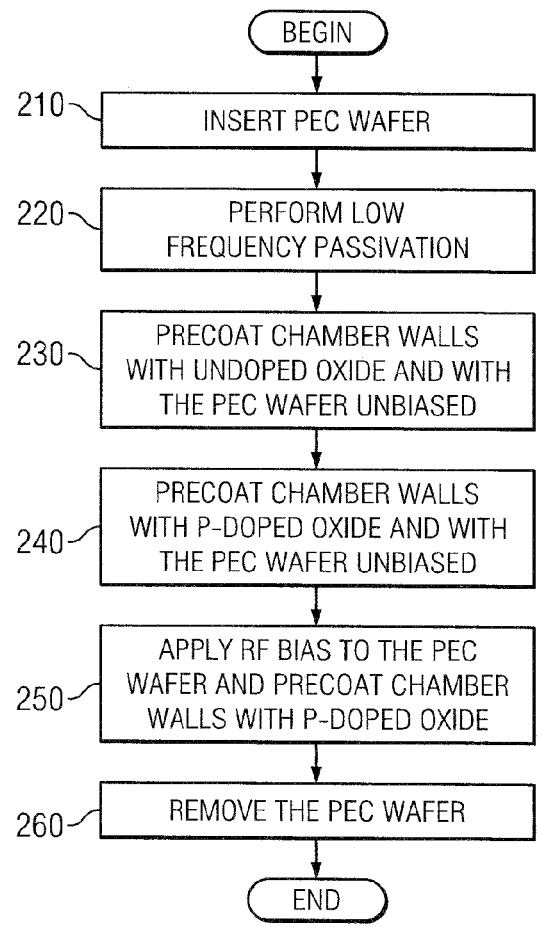
FIG. 2 is a flowchart outlining an exemplary flow diagram for performing a biased precoat process for the semiconductor apparatus according to various embodiments of the invention.

FIG. 2 is a flowchart outlining an exemplary flow of a method, performed in deposition chamber 100, for performing a biased precoat process during HDP CVD processing to reduce first wafer defects in accordance with various embodiments. One of ordinary skill in the art will appreciate that the flow diagram depicted in FIG. 2 represents a generalized schematic illustration and that other steps may be added or existing steps may be removed or modified.

After performing film deposition on a number of silicon wafers, an accumulation of deposition material and other materials on the interior surfaces of deposition chamber 100, and in particular on walls of dome 105 and the injectors, becomes problematic. For example, the accumulated material can flake off during film deposition and contaminate a film deposited on a silicon wafer. Therefore, deposition chamber 100 is typically cleaned and precoated after each processing cycle, such as after deposition a batch of five silicon wafers. As shown in step 210, a PEC wafer can be inserted into deposition chamber 100 and placed on E-chuck 130. The PEC wafer can be inserted after the last silicon wafer has been removed from deposition chamber 100, either prior to the cleaning process or prior to the precoat process. In step 220, a low frequency passivation is performed to passivate the interior surfaces of deposition chamber 100 in preparation for the precoat process.

Next, in steps 230 to 250, precoat gases can be inlet into deposition chamber 100 and turned into plasma 110 to precoat the interior surfaces of deposition chamber 100, and in particular the walls of dome 105 and the injectors, with various oxides. Precoat steps 230 to 250 bring deposition chamber 100 to an equilibrium state so that subsequent deposition of film onto silicon wafers yields consistent deposition rates. Depending on the nature of the oxide deposited, the precoat layer may consist of multiple layers of undoped and doped oxides to produce best adhesion properties.

According to various embodiments, in step 250, RF source 140 can bias the PEC wafer by applying HF RF power to E-chuck 130 while deposition chamber 100 is being precoated with the doped oxide. Thus, the biased precoat process as shown in step 250 can simultaneously precoat deposition chamber 100 with the doped oxide and bias the PEC wafer. The application of bias on the PEC wafer can cause gas flow patterns in deposition chamber 100 that dislodge loose material on dome 105 and the injectors to form loose particles. If the PEC wafer is not biased during the precoat process, then the loose material would instead become dislodged when bias is initially applied to a silicon wafer in a film deposition process after the cleaning and precoat processes.

Therefore, the biased PEC wafer can cause the precoat gas and plasma 110 generated therefrom to flow in a precoat gas flow pattern in deposition chamber 100 substantially identical to a processing gas flow pattern during subsequent film deposition. The precoat gas flow pattern can then cause loose particles in deposition chamber 100 to fall on and/or couple with the PEC wafer during the precoat process. If the PEC wafer is not biased, then the loose particles would fall on the silicon wafers and in particular the first silicon wafer during film deposition subsequent to the cleaning and precoat processes. If the loose particles fall on the silicon wafers during film deposition, the loose particles would become embedded in the deposited film and cause rip-outs during CMP. By applying HF RF power that biases the PEC wafer during precoat, the loose materials in interior surfaces of deposition chamber 100 become dislodged as loose particles during precoat, and the loose particles fall on the PEC wafer instead of the silicon wafers during film deposition, thereby minimizing yield losses caused by embedded loose particles.

According to various embodiments, RF source 140 can apply 500 or more watts of HF RF power to bias the PEC wafer without damaging or breaking the PEC wafer. In an embodiment, RF source 140 can apply 500 or more watts of HF RF power to bias the PEC wafer to cause loose particles in deposition chamber 100 to fall on and/or couple with the PEC wafer during the precoat process, which reduces a defect rate of subsequently processed silicon wafers caused by the loose particles. Finally, in step 260 the PEC wafer is removed from deposition chamber 100 prior to commencing film deposition and/or other HDP CVD processes.

Figure 3A:
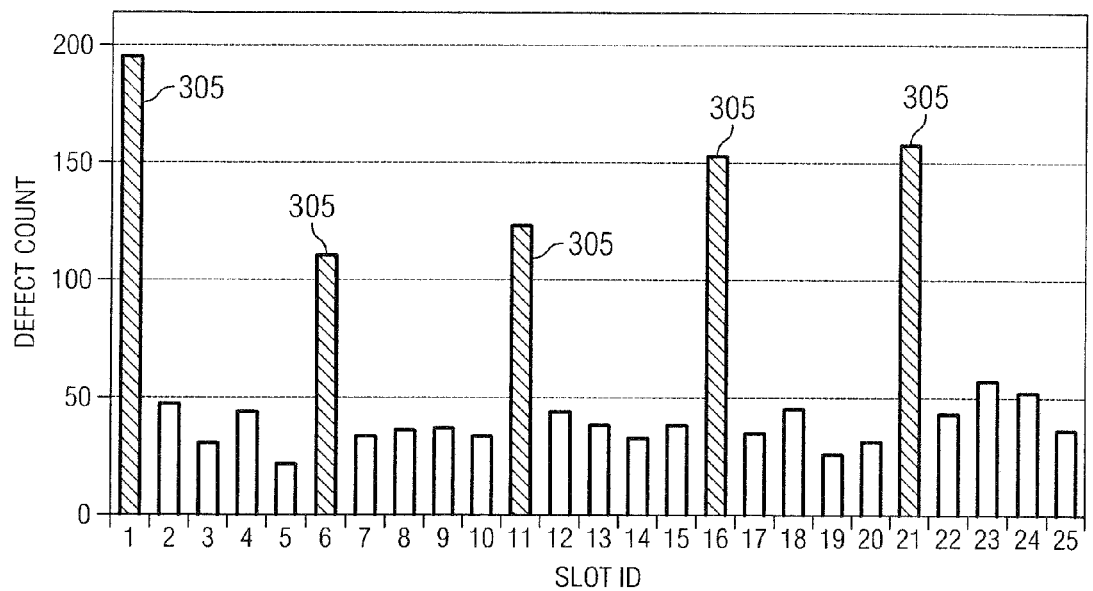
FIG. 3A is a graph illustrating wafer defect counts for a conventional high-density plasma chemical vapor deposition process.
Figure 3B:
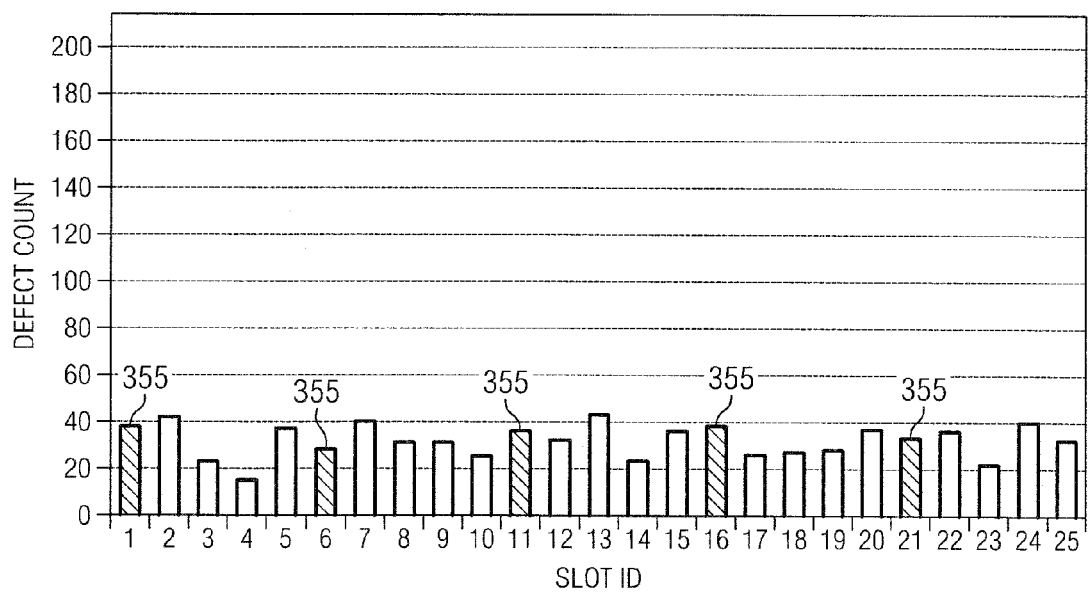
FIG. 3B is a graph illustrating wafer defect counts for an exemplary high-density plasma chemical vapor deposition process that performs a biased precoat process according to various embodiments of the invention.

FIG. 3A illustrates wafer defect counts for conventional HDP CVD processes in which the deposition chamber is cleaned and precoated after processing a batch of five silicon wafers and the PEC wafer is not biased during precoat. FIG. 3B illustrates wafer defect counts for exemplary HDP CVD processes that include a biased precoat process according to various embodiments of the invention. For example, as shown in FIG. 3A, wafer defect counts 305 for first silicon wafers processed subsequent to the cleaning and precoat processes can reach nearly 200 defects and average about 150 defects, which is about four times higher than wafer defect counts for the subsequently processed silicon wafers. In contrast, exemplary wafer defect counts 355 as shown in FIG. 3B average less than 35 defects for first silicon wafers processed subsequent to the cleaning and biased precoat processes, which translates to a greater than seventy-five percent reduction in first wafer defects.

One of ordinary skill in the art will recognize that the methods disclosed herein are exemplary and that the steps of the methods may be performed in a different order than illustrated or simultaneously. Further, it should be appreciated that, while the disclosed methods have been described in conjunction with HDP CVD semiconductor fabrication processes and apparatus, exemplary methods according to this disclosure are not limited to such applications. Exemplary embodiments of methods according to this disclosure can be advantageously applied to virtually any process and apparatus that perform vapor deposition to deposit a film on a substrate. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for reducing first wafer defects, comprising:
   inserting a protective cover on a wafer holder in a high-density plasma chemical vapor deposition chamber;
   applying power to bias the protective cover;
   precoating the deposition chamber with an oxide simultaneous to the step of applying power to bias the protective cover; and
   depositing a film on a silicon wafer subsequent to the step of precoating the deposition chamber;
   wherein the step of applying power to bias the protective cover causes a first gas flow pattern in the deposition chamber during the step of precoating; and
   wherein a second gas flow pattern in the deposition chamber during the step of depositing the film is substantially identical to the first gas flow pattern.

2. The method according to claim 1, wherein the step of applying power further comprises applying high frequency radio frequency power to bias the protective cover.

3. The method according to claim 2, wherein the step of applying power further comprises applying 500 or more watts of power to bias the protective cover.

4. The method according to claim 2, wherein the protective cover is a protective electrostatic chuck cover (PEC) wafer.

5. The method according to claim 4, wherein the PEC wafer comprises ceramic.

6. The method according to claim 1, wherein the first gas flow pattern in the deposition chamber causes loose particles in the deposition chamber to couple with the protective cover during the step of precoating.

7. The method according to claim 1, wherein
   the first gas flow pattern in the deposition chamber causes loose particles in the deposition chamber to couple with the protective cover during the step of precoating; and
   a defect rate of the silicon wafer caused by the loose particles is reduced by at least fifty percent.

8. The method according to claim 1, wherein
   the first gas flow pattern in the deposition chamber causes loose particles in the deposition chamber to couple with the protective cover during the step of precoating; and
   a defect rate of the silicon wafer caused by the loose particles is reduced by at least seventy-five percent.

9. A method of semiconductor device processing in a high-density plasma chemical vapor deposition chamber, comprising:
   running the deposition chamber for deposition of film on a first batch of a plurality of silicon wafers;
   cleaning interior surfaces of the deposition chamber subsequent to the step of running the deposition chamber;
   inserting a protective electrostatic chuck cover (PEC) wafer on an electrostatic chuck in the deposition chamber;
   applying power to bias the PEC wafer;
   precoating the deposition chamber with an oxide simultaneous to the step of applying power to bias the PEC wafer; and
   re-starting the deposition chamber for deposition of film on a second batch of a plurality of silicon wafers.

10. The method according to claim 9, wherein the step of applying power further comprises applying high frequency radio frequency power to bias the protective cover.

11. The method according to claim 10, wherein the step of applying power further comprises applying 500 or more watts of power to bias the PEC wafer.

12. The method according to claim 9, wherein the step of applying power causes loose particles in the deposition chamber to couple with the PEC wafer during the step of precoating.

* * * * *